United States Patent [19]

Yates

[11] Patent Number: 4,979,897

[45] Date of Patent: Dec. 25, 1990

[54] ATMOSPHERIC DOOR CLOSURE

[75] Inventor: Cleon R. Yates, Austin, Tex.

[73] Assignee: CRYCO Twenty-Two, Inc., Austin, Tex.

[21] Appl. No.: 423,343

[22] Filed: Oct. 18, 1989

Related U.S. Application Data

[63] Continuation of Ser. No. 279,845, Dec. 5, 1988, abandoned.

[51] Int. Cl.⁵ ............................................. F27D 1/18
[52] U.S. Cl. .................................... 432/250; 432/253; 432/239
[58] Field of Search ................ 432/253, 239, 241, 250

[56] References Cited

U.S. PATENT DOCUMENTS

| | | | |
|---|---|---|---|
| 4,439,146 | 3/1984 | Sugita | 432/253 |
| 4,523,885 | 6/1985 | Bayne et al. | 432/239 |
| 4,579,523 | 4/1986 | Laiquddin et al. | 432/253 |
| 4,752,219 | 6/1988 | Fisher, Jr. | 432/239 |

OTHER PUBLICATIONS

"Crystar Diffusion Components", Norton Company.

Primary Examiner—Henry C. Yuen
Attorney, Agent, or Firm—Hugh D. Jaeger

[57] ABSTRACT

Atmospheric door closure for sealing of the orifice of a process tube. A quartz end plate positions at the end of a plurality of spring loaded quartz rods to seal against the orifice of the process tube. The quartz rods slide against spring pressure behind Teflon sleeves contained in horizontal tubes. Springs in the horizontal tubes provide pressure against the quartz end plate when the quartz plate engages a process tube. A clamp and adjusting assembly secures to the paddle support shaft, and provides for alignment of the quartz rods and plate with respect to the paddle support shaft and the orifice of the process tube.

15 Claims, 6 Drawing Sheets

ATMOSPHERIC DOOR CLOSURE

This application is a continuation, of application serial no. 07/279,845, filed Dec. 5, 1988, now abandoned.

BACKGROUND OF THE INVENTION

1. Field of the Invention

The present invention relates to semiconductor processing furnaces, and more particularly, pertains to an atmospheric door closure for sealing against a process tube orifice.

2. Description of the Prior Art

Prior art clamping mechanisms have not been reliable and have caused particulate contamination. Prior art sealing devices have introduced varying degrees of particulate contamination and have provided for increased back-streaming of room atmospheric gases into the wafer process chamber. Past prior art systems have usually supported a door on a single spring biased rod. The spring would tend to relax after being exposed to heat. When the springs relaxed, the door would not seal. Also, the single rod would not provide for concentricity between the door and the paddle. When the springs oxidized, particles would be released and would migrate into the process tube. The prior art doors also had large holes and the doors would sometimes touch the paddle. The prior art systems provided little if any adjustment, a single support, and a hole in a single door.

The present invention provides an atmospheric door closure for assurance of reliability and increased wafer loads with high yields.

SUMMARY OF THE INVENTION

The general purpose of the present invention is to provide an atmospheric door closure for sealing an orifice of a process tube. The atmospheric door closure provides for a spring loaded quartz disc or plate which engages a process tube orifice with concentricity. As the assembly positions against a process tube orifice, any excess pressure which would have otherwise occurred is relieved by springs in a tube, and still allows sealing contact with a process tube orifice. Alignment of the tubes which support the quartz rods is accomplished by a variable geometry clamp and adjustment assembly which allows for adjustment along a paddle support shaft and allows for parallel adjustment of the tubes with respect to the paddle support shaft.

According to one embodiment of the present invention, there is provided an atmospheric door closure for the sealing of a process tube orifice including a clamp and adjustment assembly which secures to a paddle support shaft. A plurality of tubes containing quartz rods in sleeves locate horizontally through the clamp and adjustment assembly contain springs which tension against the quartz rods. A quartz plate positions on one end of the quartz rods as the quartz plate comes into contact with a process tube orifice. Appropriate set screw adjustments in the clamp and adjustment assembly allows for alignment of the quartz rods and encompassing tubes. A metal door is supported on the tubes for sealing against a scavenger face of the furnace.

One significant aspect and feature of the present invention is a door closure which prevents and/or minimizes back-streaming of gases.

Another significant aspect and feature of the present invention is a system of clamping two quartz support rods which allows the position of the rods to be adjusted to precisely align the quartz door with the silicon carbide paddle support.

A further significant aspect and feature of the present invention is the location of the springs which bias the quart plate. By locating and isolating springs behind Teflon sheathing bushing elements, the springs are protected from process gases which cause deterioration and oxidation. The springs are behind the Teflon bushing elements in which the quartz rods slide.

Still another significant aspect and feature of the present invention is an atmospheric door closure for oxidation processes in semiconductor substrate processes.

Having thus described principal embodiments of the present invention, it is a principal object hereof to provide an atmospheric door closure for sealing of a wafer process tube and a scavenger face.

One object of the present invention provides a reliable support structure which assures complete elimination of contact between the quartz sealing plate and silicon carbide paddle thereby reducing particulate contamination and back-streaming.

Another object of the present invention are springs that are totally enclosed and shielded to further reduce particulate contamination, while providing dependability and spring longevity.

A further object of the present invention is an adjustable stainless steel scavenger door which provides total closure of scavenger face, greatly reducing leakage of process gases into surrounding room.

Still another object is to provide doors with tight concentricity for engagement against the process tube and the scavenger face.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
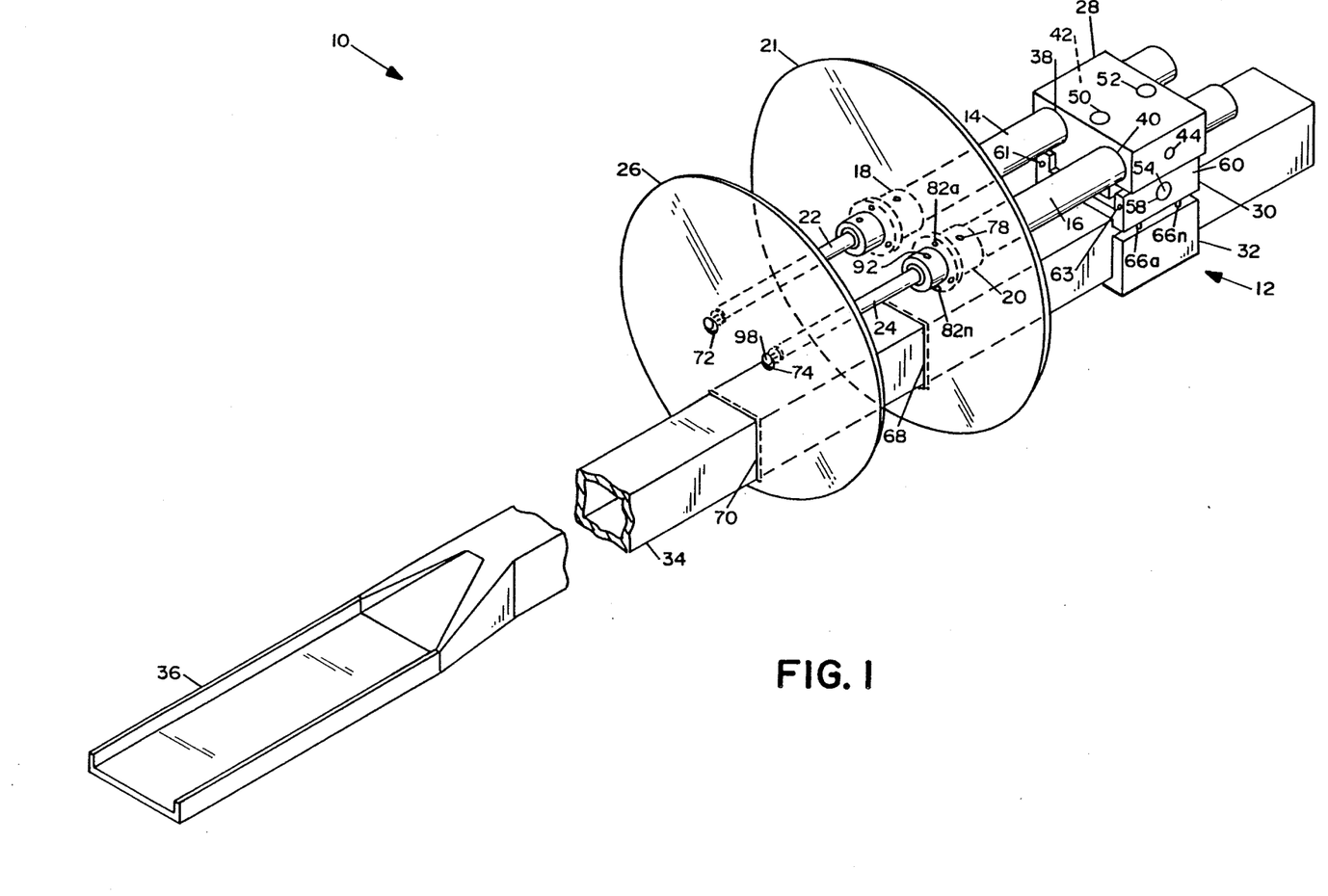
FIG. 1 illustrates a perspective view of an atmospheric door closure.
Figure 2:
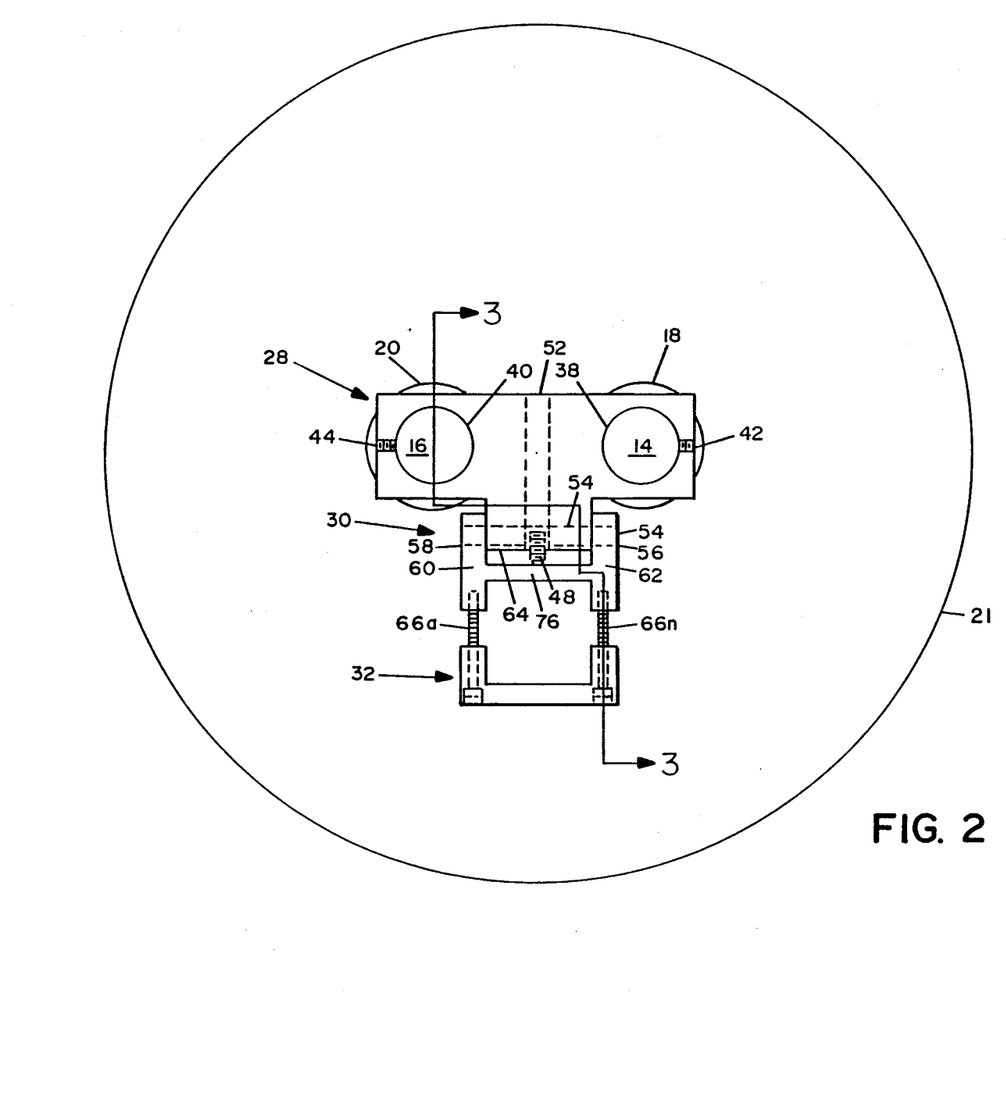
FIG. 2 illustrates an end view of the atmospheric door closure.
Figure 3:
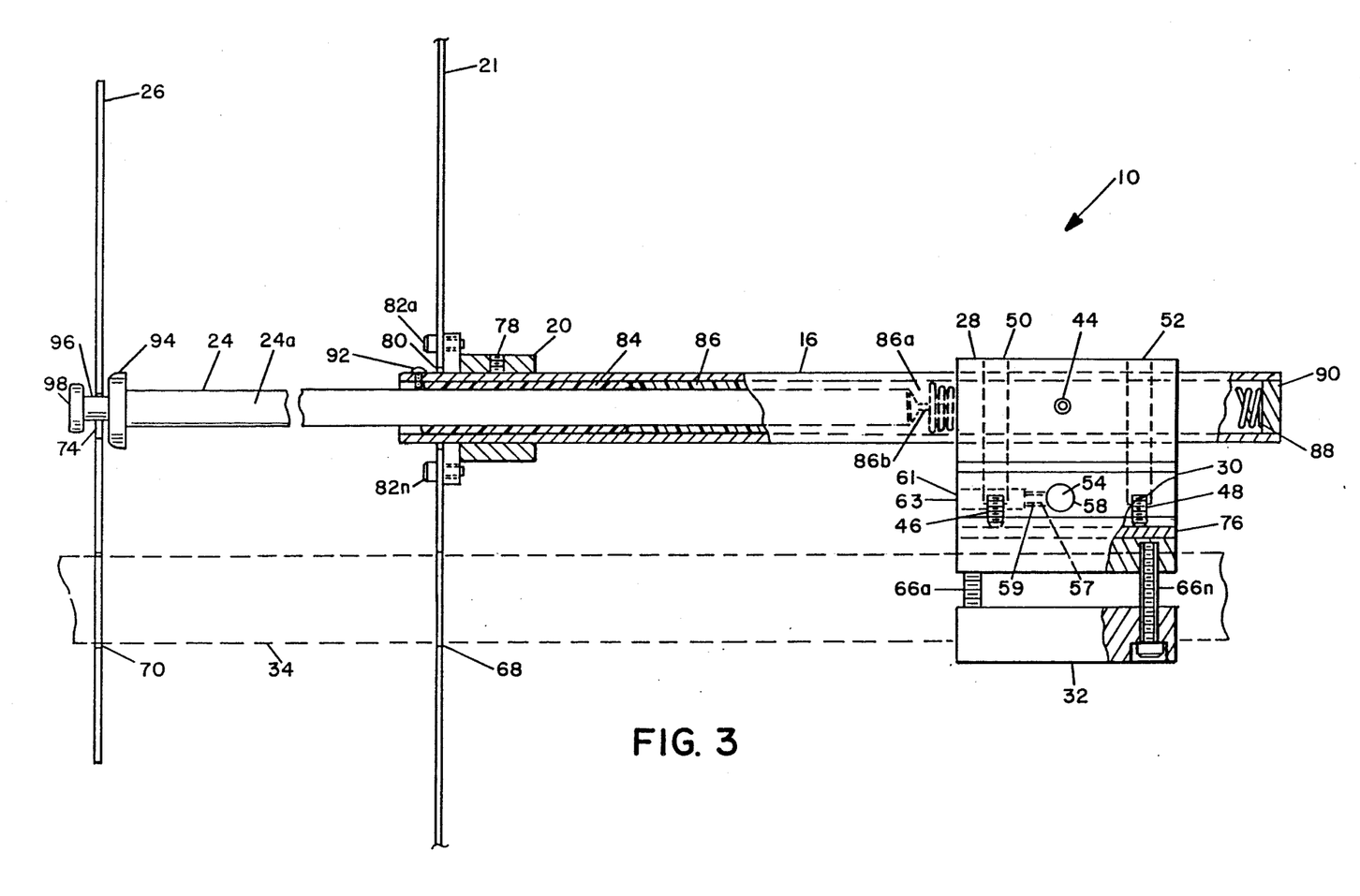
FIG. 3 illustrates a side view in cross section of the atmospheric door closure taken along line 3—3 of FIG. 2.

FIG. 1 illustrates a perspective view of an atmospheric door closure 10 for sealing a substrate process tube. The main components illustrated in this figure include a clamp and adjusting assembly 12, tubes 14 and 16 extending at right angles through members of the clamp and adjusting assembly 12, flanges 18 and 20 secured to ends of tubes 14 and 16, a circular scavenger door 21 secured perpendicular to flanges 18 and 20, spring loaded quartz rods 22 and 24 extending through flanges 18 and 20 and into tubes 14 and 16, and a circular quartz end plate 26 mounted to and perpendicular to the spring loaded quartz rods 22 and 24. The clamp and adjusting assembly 12 includes a sliding rod holder 28, a top clamp 30 and a bottom clamp 32. The atmospheric door closure 10 is shown mounted about a paddle support shaft 34 and with a minimal clearance thereabout. A silicon carbide or ceramic paddle 36 is located at the end of the paddle support shaft 34. The paddle includes a paddle handle, a paddle transition, and a substrate load zone. Tubes 14 and 16 slidingly engage horizontally aligned holes 38 and 40 in the sliding rod holder 28, and are secured therein by set screws 42 and 44 in the sliding rod holder 28 which are aligned perpendicular to the tubes 14 and 16. Set screws 46 and 48, illustrated in FIGS. 2 and 3, align in holes 50 and 52 in the sliding rod holder 28 to adjust angular elevation of the tubes 14 and 16 about a pivot pin 54. Pivot pin 54 extends through holes 56 and 58, and is secured by set screws 57 and 59 in holes 61 and 63 in the vertical members 60 and 62 of the top clamp 30 and also through an extending member 64 of the sliding rod holder 30 as illustrated in FIG. 3. The top clamp 30 and the bottom clamp 32 secure over and tighten about the paddle support shaft 34 with a plurality of machine screws 66a–66n as also illustrated in FIGS. 2 and 3. Holes 68 and 70, in the scavenger door 21 and the quartz end plate 26, accommodate the paddle support shaft 34. There is a tight tolerance of about 70 thousands of an inch about the paddle and can be in a range of 10-100 thousands of an inch. There is no contact between paddle and doors which prevents back-streaming during process times. Holes 72 and 74 align horizontally along the horizontal diameter of the quartz end plate 26 to accommodate the ends of the quartz rods 22 and 24 in axial alignment as later described in detail.

The location of the second door support apertures in the process tube door 26 are important. This is significant since the holes provide equal pressure against the seal along the entire periphery of the door. It is particularly important that there be no contact between the paddle support shaft, the stainless steel door, or the quartz end plate. Any contact would result in the generation of contaminating particles and would distort the force of the sealing springs to produce uneven pressure against the seal.

FIG. 2 illustrates an end view of the atmospheric door closure 10 where all numerals correspond to those elements previously described. Particularly illustrated is the extended member 64 extending downwardly from the main horizontally aligned portion of the sliding rod holder 28 to align between the vertical members 60 and 62 of the top clamp 30. A horizontal member 76 extends horizontally between the vertical member 60 and 62 of the top clamp 30. Set screws 46 and 48 in the sliding rod holder 30, as also illustrated in FIG. 3, tighten against the horizontal member 76 to pivotally align the sliding rod holder 28 and associated members to a horizontal position and parallel to the paddle support shaft 34.

FIG. 3 illustrates a side view in cross section of the atmospheric door closure 10 taken along line 3—3 of FIG. 2 where all numerals correspond to those elements previously described. Illustrated in particular is the tube 16 and the associated members attached thereto. Tube 14 is identical to tube 16 and functions in a like and similar manner. The circular flange 20 is adjustable along the tube 16 and secures over and about the tube 16 with a set screw 78. The scavenger door 21 includes a central hole 80 aligned over the tube 16, and secures to the circular flange 20 with a plurality of fasteners 82a–82n. The interior of the tube 16 contains a horizontally aligned Teflon front sleeve bushing 84, a Teflon rear sleeve bushing 86, a spring 88 and a plug 90 frictionally engaged in the end of the tube 16. The Teflon front sleeve bushing 84 and the Teflon rear sleeve bushing 86 are sprung to the left and against a retainer screw 92, which secures through the wall of the tube 16 by the spring 88, and between the plug 90 and the Teflon rear sleeve bushing 86. The Teflon front sleeve bushing 84 is open at opposing ends. The Teflon rear sleeve 86 is open at one end and includes a closed end 86a at the opposite end, which abuts one end of the spring 88. A relief passage 86b is located in the closed end 86a. The quartz rod 24 is accommodated coaxially by the interior of Teflon front sleeve bushing 84 and the interior of the Teflon rear sleeve bushing 86 and rests against end 86a of the Teflon rear sleeve bushing 86. The location of the Teflon bushings provides isolation of the Teflon from the high process temperatures. The quartz rods have low thermal conductivity so that the heat conveyed to the bushings is minimized. Since the bushings are in intimate contact with the metallic support tubes, any heat which does reach the bushings is rapidly conveyed away. One end of the quartz rod 24 includes an integral quartz annular ring 94, an integral quartz central shaft 96 of less diameter than the main portion 24a of the quartz rod 24 extending outwardly from the annular ring 94, and another integral quartz annular ring 98 whose diameter is larger than the central shaft 96 but less than the diameter of the annular ring 94 extending outwardly from the central shaft 96. Hole 74, located along a horizontal diameter of the quartz end plate 26, is of sufficient diameter to pass over the annular ring 98 and is passed over the annular ring 98 to loosely engage the central shaft 96 between the annular rings 94 and 98.

MODE OF OPERATION

Figure 4:
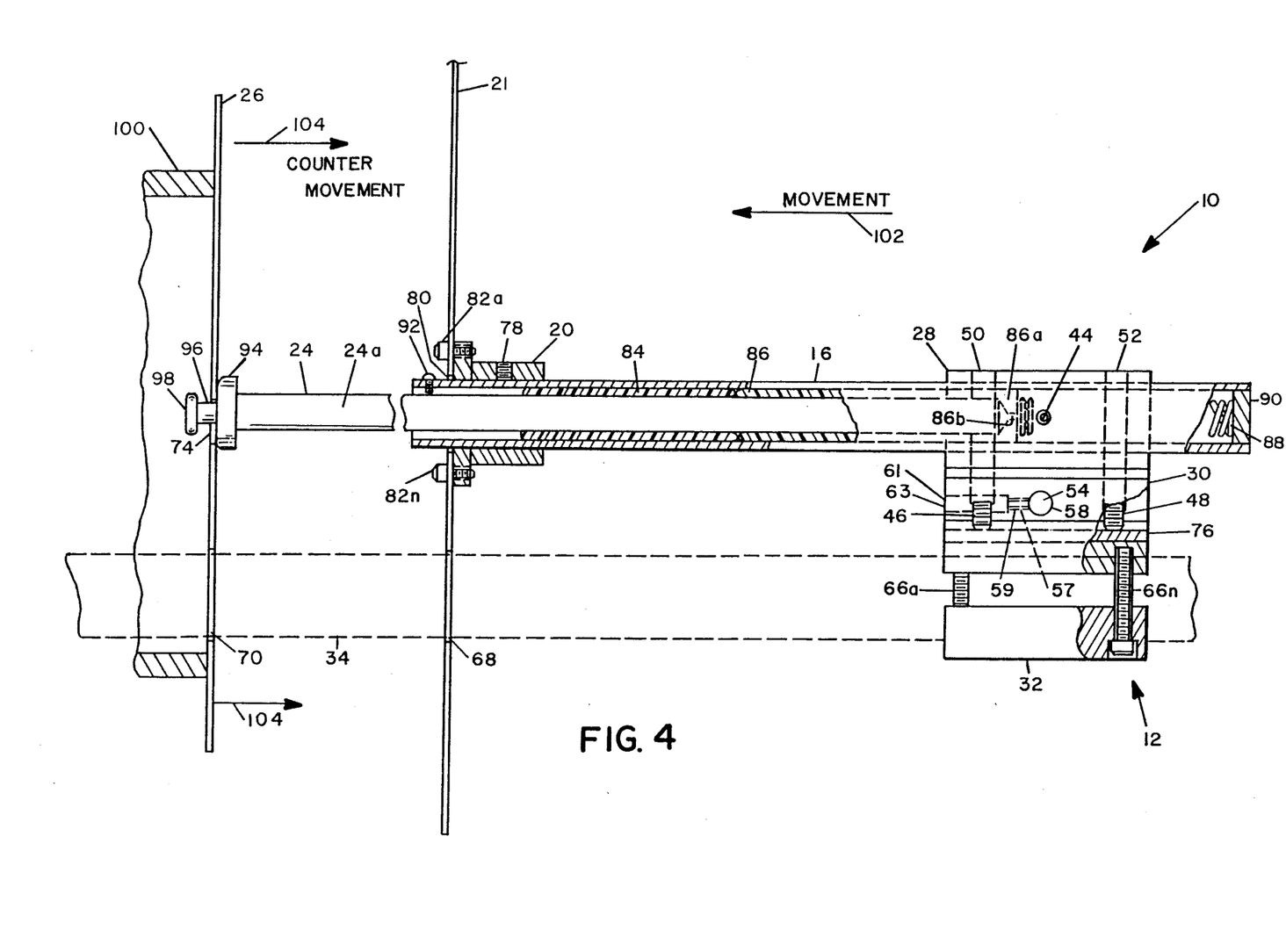
FIG. 4 illustrates the mode of operation of the atmospheric door closure.
Figure 5:
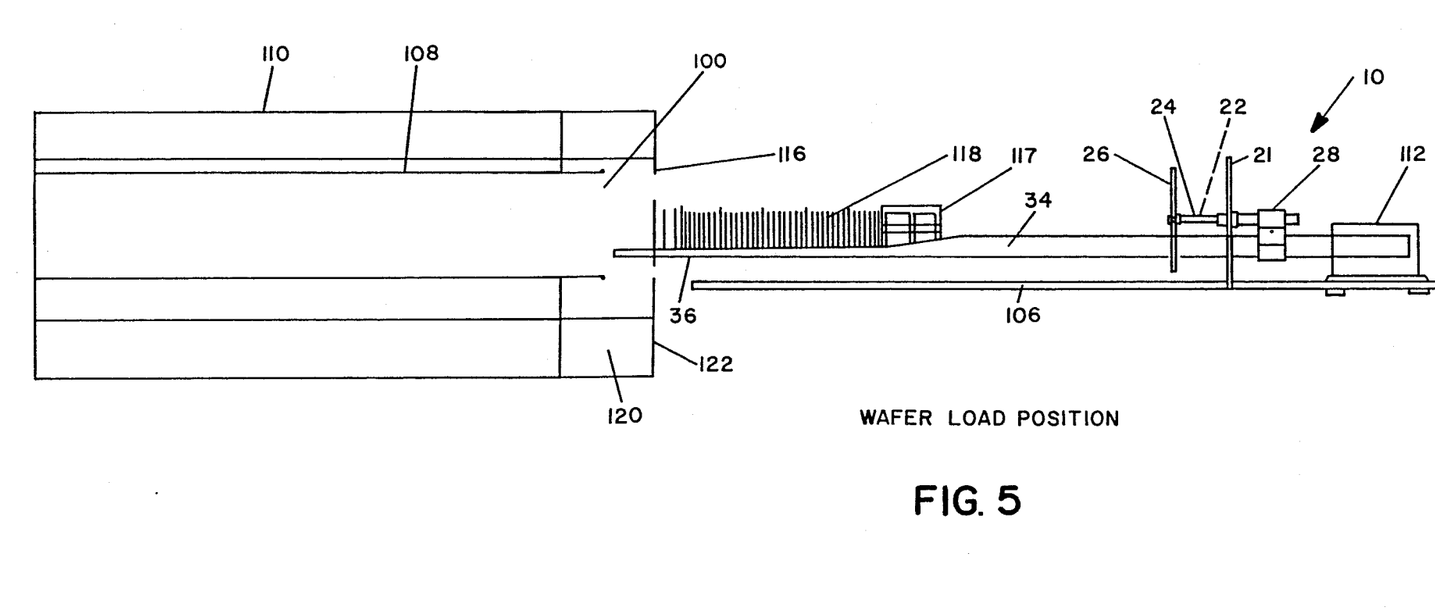
FIG. 5 illustrates the atmospheric door closure in a wafer load position.
Figure 6:
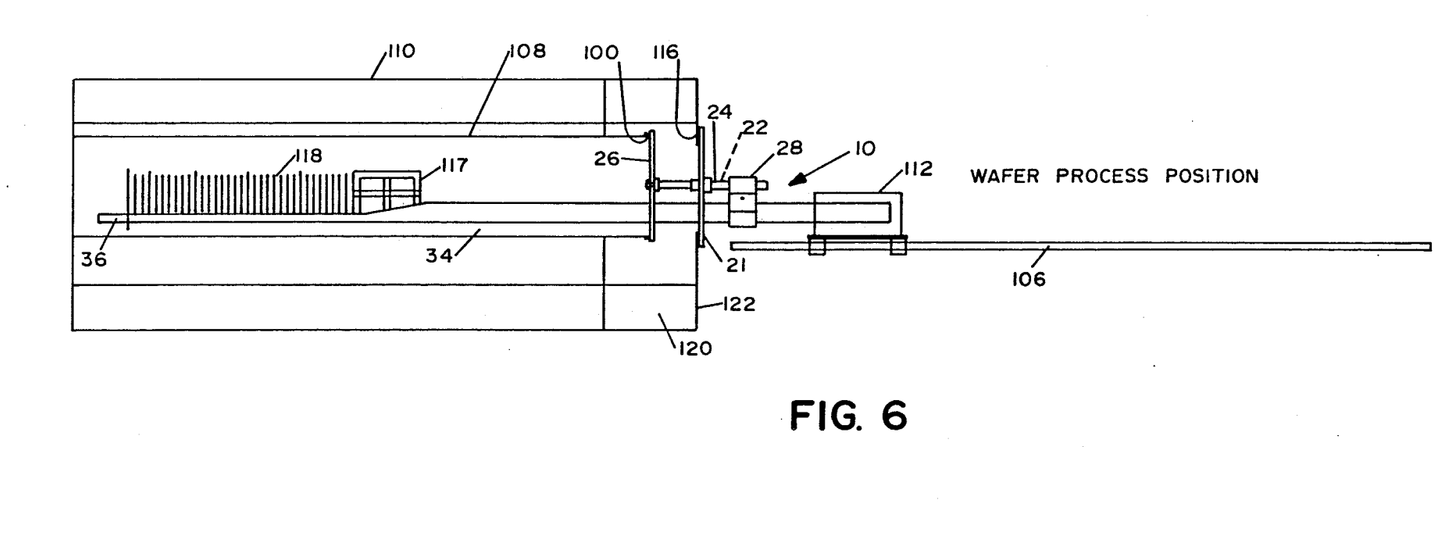
FIG. 6 illustrates an atmospheric door closure in a wafer process position.

FIGS. 4–6 illustrates the mode of operation where all numerals correspond to those elements previously described. The atmospheric door closure 10 is mounted on a paddle support shaft 34 by tightening the plurality of machine screws 66a–66n to draw the top clamp 30 towards the bottom clamp 32, thus securing the clamp and adjusting assembly 12 to the paddle support shaft 34. The paddle is representative of a paddle made by Norton Company Advanced Ceramics of Worcester, Mass. The sliding rod holder 28 is then adjusted to attain parallel alignment of the tubes 14 and 16 with respect to the paddle support shaft 34, and consequently perpendicular alignment of the quartz end plate 26 to a process tube orifice 100. The sliding rod holder 28 is aligned by adjusting set screws 46 and 48 against the horizontal member 76 of the top clamp 30 causing pivotal motion of the sliding rod holder 28 about the pivot pin 54 to achieve proper alignment.

Sealing of the process tube orifice 100 is now accomplished by movement of the paddle support shaft 34 upon which the atmospheric door closure 10 is secured in the direction indicated by movement arrow 102. As the quartz end plate 26 contacts the process tube orifice 100, the quartz end plate 26 concentrically aligns itself to the general plane of the process tube orifice 100. As the hole 74 of the quartz end plate 26 is loosely engaged over the central shaft 96 of the quartz rod 24, self aliqnment is easily and readily obtained. As movement of the atmospheric door closure continues in the direction of the movement arrow 102, pressure between the annular ring 94 against the quartz end plate 26 increases only slightly as counter movement with respect to the tube 16 of the quartz end plate 26, the quartz rod 24 and the Teflon front and back sleeves bushings 84 and 86 occurs against the spring 88 in the direction of the arrow 104. The compression force required to properly seal the quartz end plate 26 against the process tube orifice 100 is determined by the spring constant of the spring 88 between the plug 90 and the end 86a of the sleeve bushing 86. Naturally, a nominal spring constant is utilized to place as minimal pressure as required on the quartz end plate 26 by the two quartz rods 22 and 24.

FIG. 5 illustrates the atmospheric door closure 10 in a wafer load position mounted on a track system 106, adjacent to a process tube 108, in a wafer furnace 110. All numerals correspond to those elements previously described. A paddle support clamp 112 secures the paddle support shaft 34 in a horizontal position parallel to the track system 106, and the atmospheric door closure 10 secures to the paddle support shaft 34 as previously described. The process tube 108 includes a process tube orifice 100, and the wafer furnace 110 includes a furnace orifice 116, each of which engages associated members of the atmospheric door closure 10. A wafer boat 117, including wafers 118 ready for processing, is illustrated resting on the silicon carbide paddle 36. A scavenger area 120 and a scavenger face 122 are also illustrated in the figure.

FIG. 6 illustrates the wafer process position where the wafers 118 are processed in the process tube 108. All numerals correspond to those elements previously described. The clamp and adjusting assembly 12 is positioned along the track system 106 to move the silicon carbide paddle 36 containing wafers 118 within the process tube 108. During this positioning, the process tube orifice 100 of the process tube 108 is sealed by the quartz end plate 26 as it comes into contact with the process tube orifice 100. As this concentricity contact occurs on engagement, the spring 88 of FIG. 4 is compressed as the paddle support shaft 34 progresses further inward until the scavenger door 21 seals against the furnace orifice 116 on the scavenger face 122. Near simultaneous sealing of the process tube orifice 100 and the furnace orifice 116 occurs as the spring loaded quartz end plate 26 first comes into contact with the process tube orifice 100, followed closely in time by sealing of the wafer furnace 110 as the scavenger door 21 comes into contact with the scavenger face 122.

Various modifications can be made to the present invention without departing from the apparent scope hereof.

I CLAIM:

1. An atmospheric door for isolating an interior of a tube from the atmosphere, the tube supporting substrates within a process tube, comprising:
   a. wafer paddle including a support handle shaft extending therefrom;
   b. a process tube door of inert quartz material;
   c. first and second support rods for said process tube door;
   d. door support ring portions at the first end of said rods;
   e. said door having a first aperture for said support shaft, and a pair of centrally located second apertures for accommodation of said door support ring portions of said support rods;
   f. first and second support tubes for accommodation of said support rods;
   g. slidable bushing means positioned intermediate to said support rods within said support tubes to accommodate relative movement between said support rods and said support tubes; and,
   h. adjustable clamp means affixed to said support shaft for simultaneously adjusting the axial alignment position of said support rods relative to said support shaft, whereby movement of said door relative to said support shaft is achieved without contact therebetween.

2. Door of claim 1 wherein said slidable bushing means includes a spring in each of said support tubes.

3. Door of claim 2 wherein Teflon bushings position between said support tubes and said support rods.

4. Door of claim 2 wherein said spring positions behind said support rods.

5. Door of claim 2 wherein each of said door support tubes are quartz.

6. Door of claim 1 including a metal door affixed to said support tubes.

7. A high temperature semiconductor process tube door for isolating the interior of said tube from the atmosphere and supporting semiconductor wafer carriers within said process tube, comprising:
   a. a semiconductor wafer paddle having a support handle shaft extending therefrom;
   b. a process tube door of inert quartz material;
   c. first and second support rods for said process tube door;
   d. door support ring portions at the first end of said rods;
   e. said door having a first aperture for said support shaft, and a pair of centrally located second apertures for accommodation of said door support ring portions of said support rods;
   f. first and second support tubes for accommodation of said support rods;
   g. slidable bushing means positioned intermediate to said support rods within said support tubes to accommodate relative movement between said support rods and said support tubes; and,
   h. adjustable clamp means affixed to said support shaft for simultaneously adjusting the axial alignment position of said support rods relative to said support shaft, whereby movement of said door relative to said support shaft is achieved without contact therebetween.

8. A door according to claim 7 wherein said door support ring portions have a stop flange portion larger in diameter than the diameter of said second apertures.

9. A door according to claim 8 wherein said stop flange portions bear against said process tube door, limiting movement of said door relative to said support rods whereby further movement of said door relative to said support rods causes movement of said support rods within said support tubes.

10. A door according to claim 9 further including:
    a. a pair of compression springs positioned within said support tubes to resist movement of said support rods into said tubes.

11. A door according to claim 10 further comprising:
    a. low friction bushing means positioned between said support rods and support tubes in axial alignment therewith for protection of said compression springs against infusion of process gases and accurate alignment of said support rods relative to said support tubes.

12. A high temperature process tube door for isolating the interior of said tube from the atmosphere and supporting substrate carriers within said process tube, comprising:
   a. a wafer paddle including a paddle handle, a paddle transition, and a wafer load zone extending therefrom for supporting the carriers;
   b. a process tube door of quartz material;
   c. first and second quartz support rods for said process tube door;
   d. door support ring portions at the first end of said rods;
   e. said door having a first aperture for said support shaft, and a pair of centrally located second apertures for accommodation of said door support ring portions of said support rods;
   f. first and second support tubes for accommodation of said support rods;
   g. slidable bushing means positioned intermediate to said support rods within said support tubes to accommodate relative movement between said support rods and said support tubes; and,
   h. adjustable clamp means affixed to said support shaft for simultaneously adjusting the axial alignment position of said support rods relative to said support shaft, whereby movement of said door relative to said support shaft is achieved without contact therebetween.

13. A door according to claim 12 further comprising a metal door on said support tubes.

14. A door according to claim 13 including flange means on said support tubes and said metal door secured to said flanges.

15. A door according to claim 14 wherein said door is stainless steel.

* * * * *